(12) United States Patent
Lutze et al.

(10) Patent No.: US 7,046,555 B2
(45) Date of Patent: May 16, 2006

(54) METHODS FOR IDENTIFYING NON-VOLATILE MEMORY ELEMENTS WITH POOR SUBTHRESHOLD SLOPE OR WEAK TRANSCONDUCTANCE

(75) Inventors: Jeffrey W. Lutze, San Jose, CA (US); Jian Chen, San Jose, CA (US); Yan Li, Milpitas, CA (US); Kazunori Kanebako, Yokohama (JP); Tomoharu Tanaka, Yokohama (JP)

(73) Assignees: SanDisk Corporation, Sunnyvale, CA (US); Kabushiki Kaisha Toshiba, Tokyo (JP)

( * ) Notice: Subject to any disclaimer, the term of this patent is extended or adjusted under 35 U.S.C. 154(b) by 296 days.

(21) Appl. No.: 10/665,685

(22) Filed: Sep. 17, 2003

(65) Prior Publication Data
US 2005/0057968 A1    Mar. 17, 2005

(51) Int. Cl.
G11C 16/04    (2006.01)

(52) U.S. Cl. .............................. 365/185.24; 365/185.15

(58) Field of Classification Search ........... 365/185.24, 365/185.15, 185.14, 185.18
See application file for complete search history.

(56) References Cited

U.S. PATENT DOCUMENTS

| | | | |
|---|---|---|---|
| 5,428,621 A | | 6/1995 | Mehrotra et al. |
| 5,675,546 A | | 10/1997 | Leung |
| 5,909,398 A | | 6/1999 | Tanzawa et al. |
| 5,978,278 A | * | 11/1999 | Lee ........................ 365/185.33 |
| 6,128,219 A | * | 10/2000 | Pio et al. ................ 365/185.09 |
| 6,229,734 B1 | * | 5/2001 | Watanabe ............... 365/185.22 |
| 6,236,609 B1 | | 5/2001 | Tanzawa et al. |
| 6,829,174 B1 | * | 12/2004 | Chang et al. .......... 365/185.29 |
| 2003/0210573 A1 | | 11/2003 | Lee |
| 2004/0111553 A1 | | 6/2004 | Conley |

FOREIGN PATENT DOCUMENTS

EP        0 686979 A1    12/1995

OTHER PUBLICATIONS

Park et al., "Degradation of Thin Tunnel Gate Oxide Under Constant Fowler-Nordheim Current Stress for a Flash Eeprom," *IEEE Transactions on Electron Devices,* vol. 45, No. 6, Jun. 1998, pp. 1361-1368.
Lee et al., "Endurance Characteristics and Degradation Mechanism of Polysilicon Thin Film Transistor EEPROMs with Electron Cyclotron Resonance $N_2O$-Plasma Gate Oxide," *Jpn. J. Appl. Phys.,* vol. 38, 1999, pp. 2215-2218.
Communication Relating to the Results of the Partial International Search mailed Feb. 15, 2005 for International Application No. PCT/US2004/030493.
Notification of Transmittal of the International Search Report and the Written Opinion of the International Searching Authority, or the Declaration, International Application No. PCT/US2004/030493 for SanDisk Corporation, mailed Jun. 22, 2005.

* cited by examiner

*Primary Examiner*—Anh Phung
(74) *Attorney, Agent, or Firm*—Parsons Hsue & de Runtz LLP

(57) ABSTRACT

A number of methods for identifying cells with poor subthreshold slope and reduced transconductance. A first set of techniques focuses on the poor subthreshold behavior of degraded storage elements by cycling cells and then programming them to a state above the ground state and the reading them with a control gate voltage below the threshold voltage of this state to see if they still conduct. A second set of embodiments focuses on weak transconductance behavior by reading programmed cells with a control gate voltage well above the threshold voltage. A third set of embodiments alters the voltage levels at the source-drain regions of the storage elements. The current-voltage curve of a good storage element is relatively stable under this shift in bias conditions, while degraded elements exhibit a larger shift. The amount of shift can be used to differentiate the good elements from the bad.

37 Claims, 8 Drawing Sheets

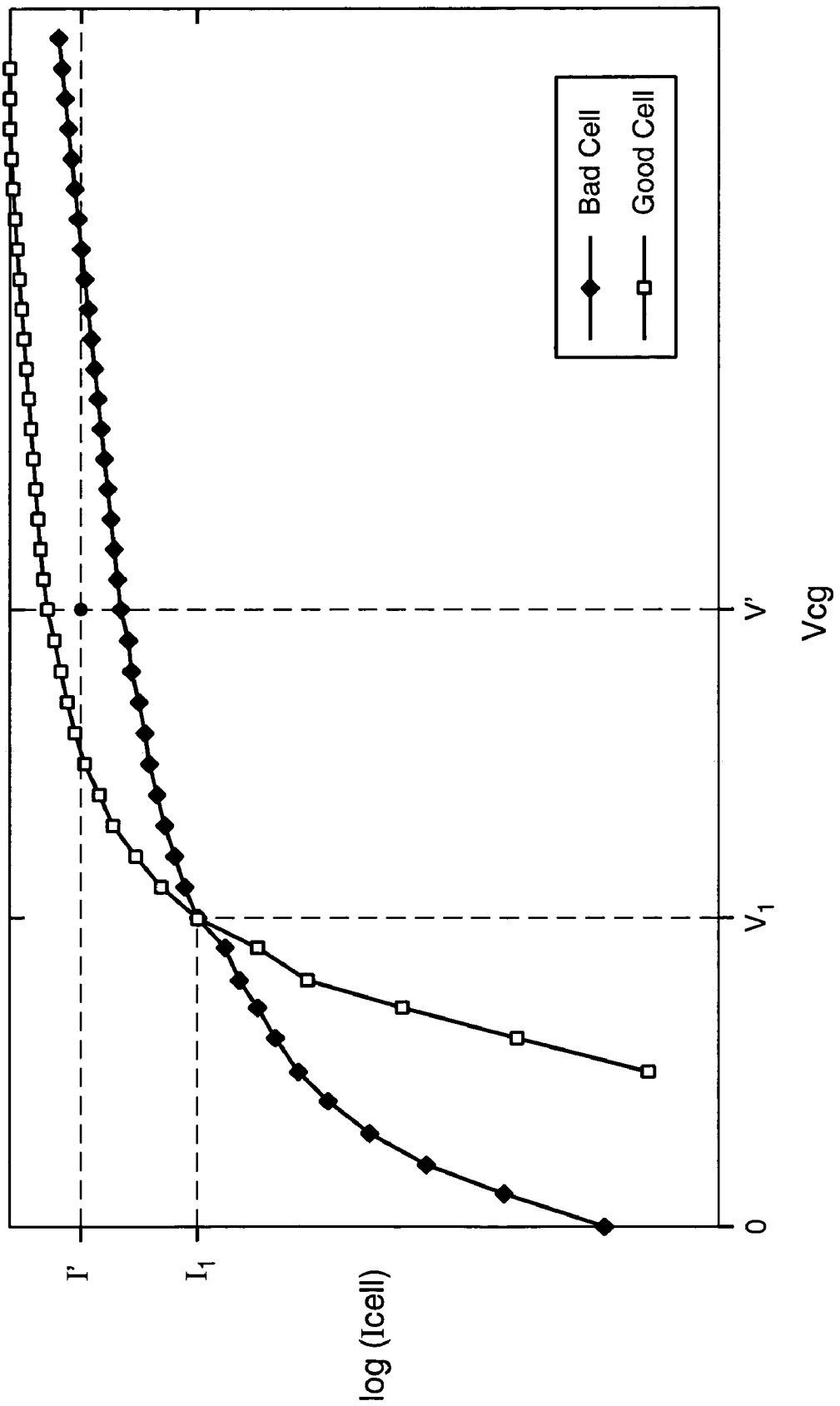
FIG._1

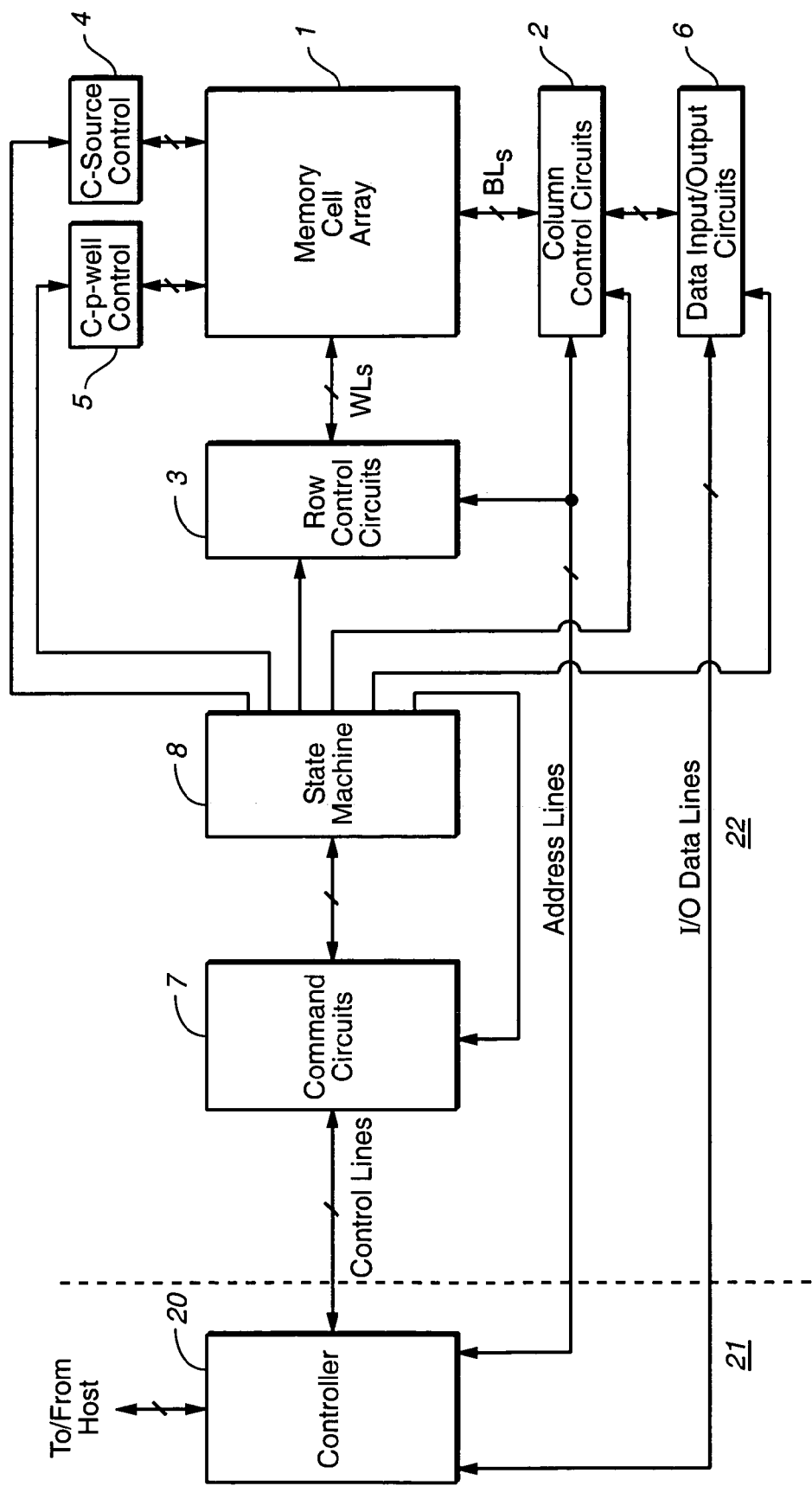
FIG._2

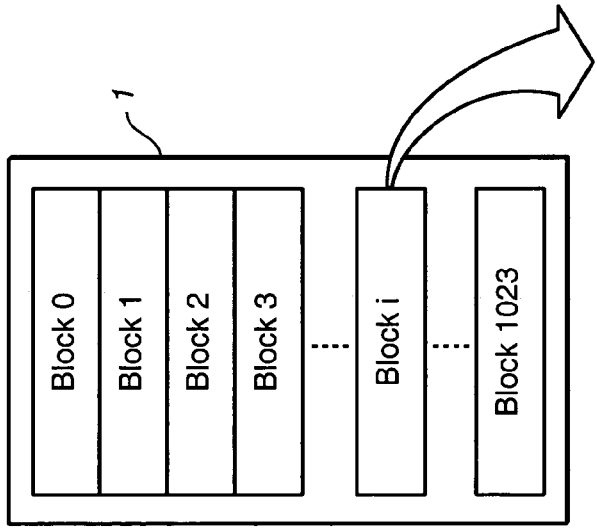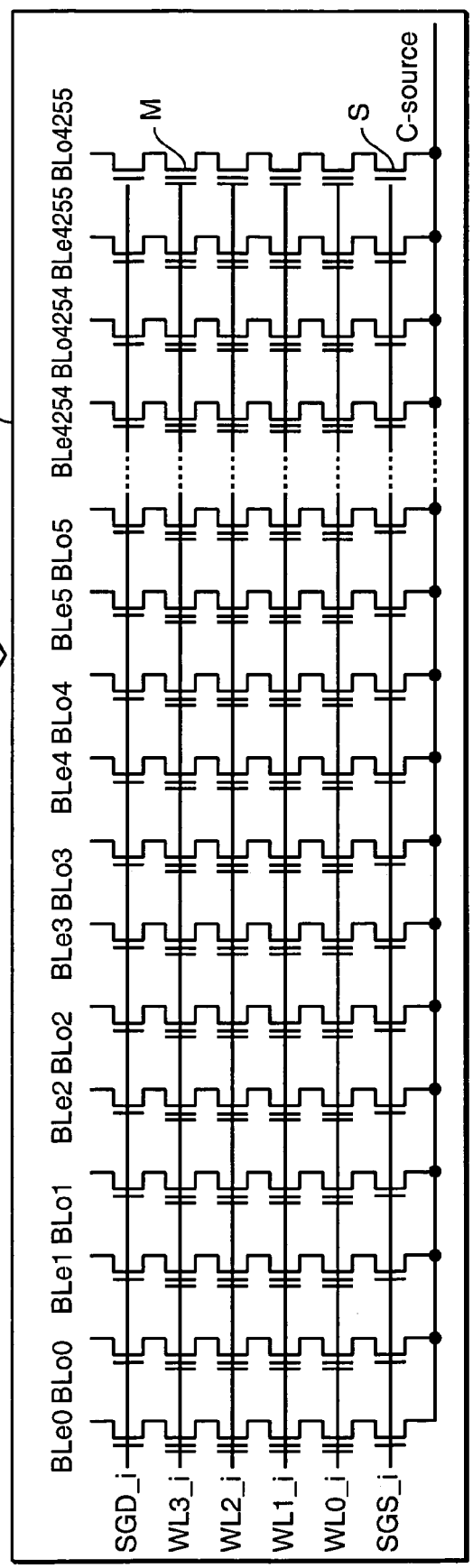
FIG._3

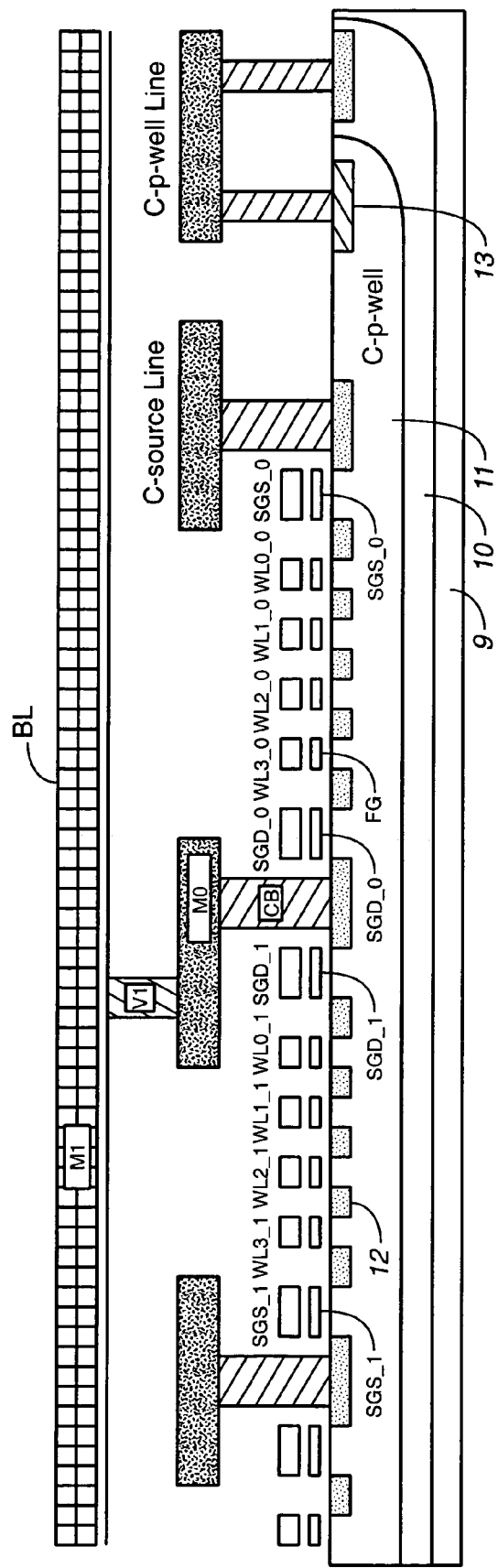
*FIG._4*

| | Erase | Program Promotion | Program Inhibition | Read10 | Read10 for 1st Pass | Read10 for 2nd Pass | Read00 | Read00 for 2nd Pass | Read01 | Verify10 for 1st Pass | Verify10 for 2nd Pass | Verify00 for 1st Pass | Verify00 for 2nd Pass | Verify01 |
|---|---|---|---|---|---|---|---|---|---|---|---|---|---|---|
| BLe | Floating | 0V | Vdd | H or L | H or L | H or L | H or L | H or L | H or L | H or L | H or L | H or L | H or L | H or L |
| BLo | Floating | Vdd | Vdd | 0V | 0V | 0V | 0V | 0V | 0V | 0V | 0V | 0V | 0V | 0V |
| SGD | Floating | Vdd | Vdd | 4.5V | 4.5V | 4.5V | 4.5V | 4.5V | 4.5V | 4.5V | 4.5V | 4.5V | 4.5V | 4.5V |
| WL3 | 0V | 10V | 10V | 4.5V | 4.5V | 4.5V | 4.5V | 4.5V | 4.5V | 4.5V | 4.5V | 4.5V | 4.5V | 4.5V |
| WL2 | 0V | Vpgm | Vpgm | 0V | 0V | 0V | 1V | 1V | 2V | 0.2V | 0.4V | 1.2V | 1.4V | 2.4V |
| WL1 | 0V | 10V | 10V | 4.5V | 4.5V | 4.5V | 4.5V | 4.5V | 4.5V | 4.5V | 4.5V | 4.5V | 4.5V | 4.5V |
| WL0 | 0V | 10V | 10V | 4.5V | 4.5V | 4.5V | 4.5V | 4.5V | 4.5V | 4.5V | 4.5V | 4.5V | 4.5V | 4.5V |
| SGS | Floating | 0V | 0V | 0V | 0V | 0V | 0V | 0V | 0V | 0V | 0V | 0V | 0V | 0V |
| C-source | Floating | 0V | 0V | 0V | 0V | 0V | 0V | 0V | 0V | 0V | 0V | 0V | 0V | 0V |
| C-p-well | 20V | 0V | 0V | 0V | 0V | 0V | 0V | 0V | 0V | 0V | 0V | 0V | 0V | 0V |

FIG._5

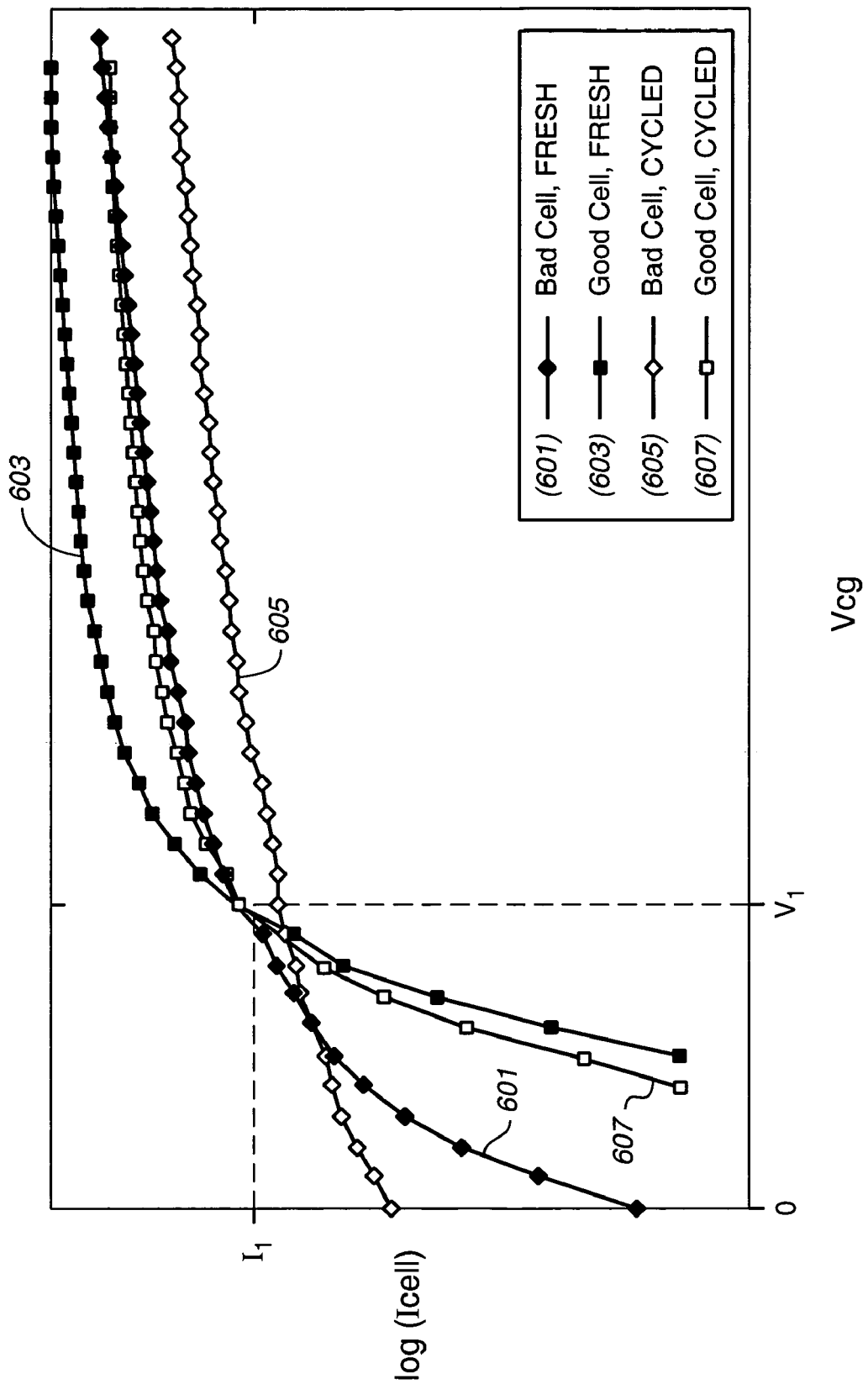
FIG._6

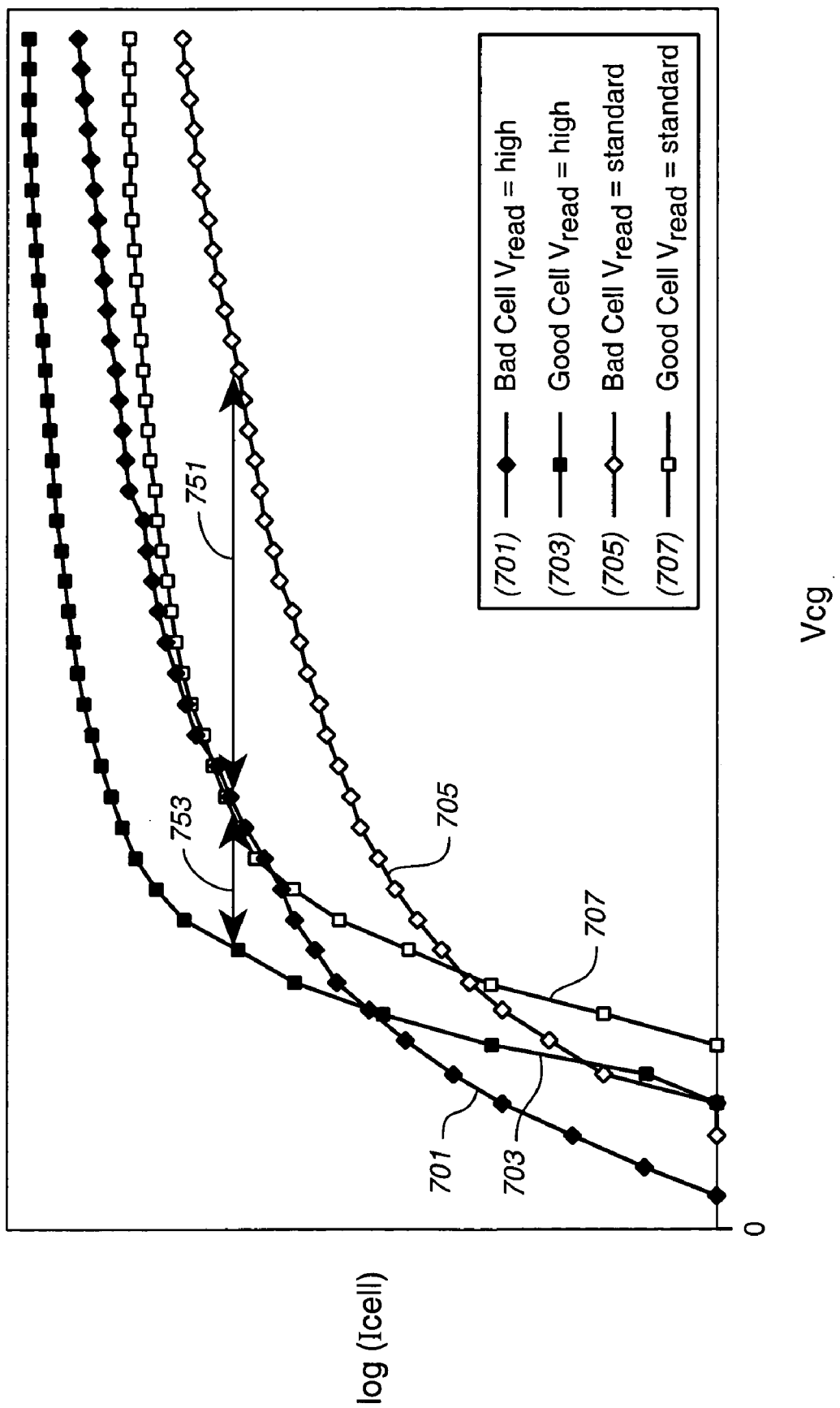
FIG._7

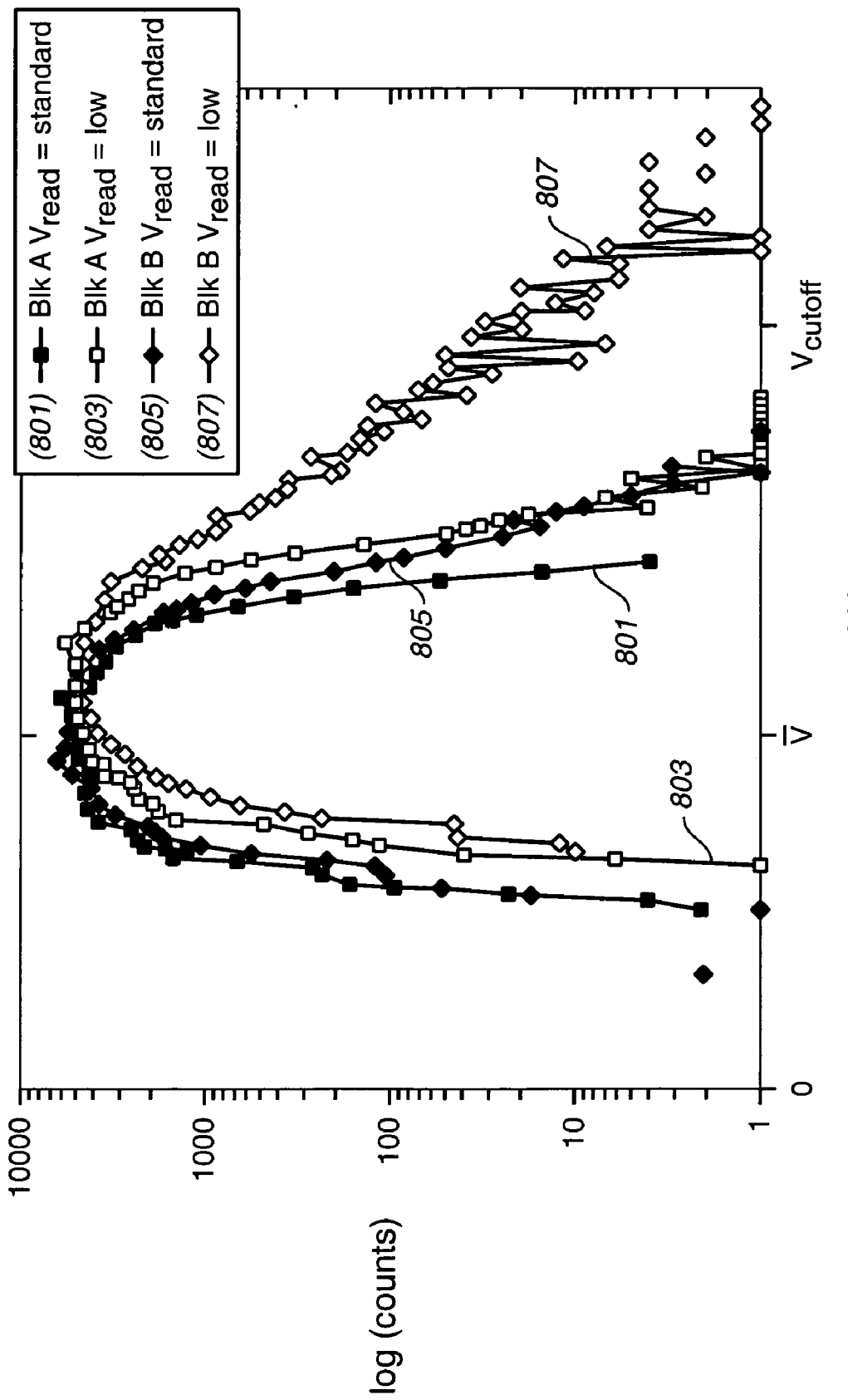
FIG._8

METHODS FOR IDENTIFYING NON-VOLATILE MEMORY ELEMENTS WITH POOR SUBTHRESHOLD SLOPE OR WEAK TRANSCONDUCTANCE

FIELD OF THE INVENTION

This invention relates generally to non-volatile memories and its operation, and, more specifically, to the determination of defective storage elements of the memory.

BACKGROUND OF THE INVENTION

The principles of the present invention have application to various types of non-volatile memories, those currently existing and those contemplated to use new technology being developed. Implementations of the present invention, however, are described with respect to a flash electrically erasable and programmable read-only memory (EEPROM), wherein the storage elements are floating gates, as exemplary.

It is common in current commercial products for each floating gate storage element of a flash EEPROM array to store a single bit of data by operating in a binary mode, where two ranges of threshold levels of the floating gate transistors are defined as storage levels. The threshold levels of a floating gate transistor correspond to ranges of charge levels stored on their floating gates. In addition to shrinking the size of the memory arrays, the trend is to further increase the density of data storage of such memory arrays by storing more than one bit of data in each floating gate transistor. This is accomplished by defining more than two threshold levels as storage states for each floating gate transistor, four such states (2 bits of data per floating gate storage element) now being included in commercial products. More storage states, such as 16 states per storage element, are contemplated. Each floating gate memory transistor has a certain total range (window) of threshold voltages in which it may practically be operated, and that range is divided into the number of states defined for it plus margins between the states to allow them to be clearly differentiated from one another. The trend towards lower power systems results in a smaller widow of available threshold voltages, further aggravating this problem.

This is true of the various types of flash EEPROM cell arrays. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and Ser. No. 09/505,555, filed Feb. 17, 2000, and Ser. No. 09/667,344, filed Sep. 22, 2000.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patents that are incorporated herein in their entirety by this reference: U.S. Pat. Nos. 5,570,315, 5,774,397 and 6,046,935 and U.S. patent application Ser. No. 09/893,277, filed Jun. 27, 2001. Other examples are given in U.S. patent applications entitled "Highly Compact Non-Volatile Memory and Method Thereof", by Raul-Adrian Cernea, and "Non-Volatile Memory and Method with Reduced Source Line Bias Errors", by Raul-Adrian Cernea and Yan Li, both filed Sep. 24, 2002 and both hereby incorporated by this reference.

Occasionally, flash memory cells are known to suffer from poor subthreshold slope or weak transconductance. These cells are sometimes referred to as $g_m$ degraded cells and typically have an undesirable current-voltage (I-V) characteristic. The cells have a reduced conductivity, but more importantly their turn-off characteristics, defined by their subthreshold slope, are very poor. Thus, the cells are still conducting at gate voltages below the threshold voltage, meaning they have a greater capacity to be read incorrectly.

FIG. 1 compares a typical I-V curve from such a $g_m$-degraded cell to a well-behaved cell, where the current is shown in a logarithmic scale. In this figure, a well-behaved, or "good", cell is shown with the open squares and a "bad" cell with degraded transconductance is shown with the black diamonds. Both cells have been programmed to a target state defined by a drain-source current level $I_{DS}=I_1$ in response to a control gate voltage $Vcg=V_1$. Aside from this point, the two curves differ, with the bad cell having a lower current for higher voltages (the degraded transconductance) and a higher current for lower Vcg values (the poor subthreshold slope part). These cells become worse as the memory is cycled and the cell characteristics can be improved if the cycling damage is allowed to relax. Thus, it is likely that some type of charge model, for example interface states, plays a role in causing the poor subthreshold slope and reduced transconductance. These cells can cause stored data to be corrupted if the subthreshold slope deteriorates to the point that the cell is still conducting even when the gate voltage is below the cell threshold. This significantly reduces the read margin and makes the cell very susceptible to "flipping bits" if the read conditions are varied. For example, the point $I_1$-$V_1$ were the lines cross would likely be determined by the program verify conditions corresponding to some memory state's target values, which will often differ by some margin from the control read voltage used for this state. Consequently, the bad cell's current level corresponding to this read voltage will differ from that of the good cell, even though they have both been programmed to the same state. In fact, this phenomenon is usually seen when memories fail after cycling due to some cells flipping from a programmed to an erased state. Additionally, it has been found that bad cells tend to drift form their programmed value at a faster rate than the good cells.

Although the discussion has been in terms of flash memory cells, more generally it will be true of any memory using a transistor based non-volatile storage element where the current-voltage properties determine the written data state, for example a dielectric storage element. A method to identify cells suffering from this phenomenon before they corrupt the stored data would be highly advantageous.

SUMMARY OF THE INVENTION

The present invention presents a number of methods for identifying cells with poor subthreshold slope and reduced transconductance. These allow the significant difference in I-V characteristic of a degraded cell versus a well-behaved cell to be used to identify the degraded cells and remove them from the useful portion of the memory before they cause data corruption. A first set of techniques focuses on the poor subthreshold behavior of degraded storage elements: the cells are programmed to a state above the ground state and read with a control gate voltage below the threshold voltage of this state. Well-behaved elements will be fully off and have essentially no drain-source current, while a defective cell will still produce a measurable amount of current. If this process is performed at test time for a new memory, the tested elements can be cycled first to increase this effect. In an exemplary embodiment, the programmed elements are read with the control gates set to ground and a low current level threshold is used to differentiate degraded cells from good cells.

A second set of embodiments focuses on the weak transconductance behavior of degraded storage elements: the cells are programmed to a state above the ground state and then read with a control gate voltage well above the threshold voltage of this state, say at around twice $V_{th}$. As the good cells with have a significantly higher drain-source current at this increase voltage than the degraded cells, they can be differentiated on this basis. As with the other methods, these techniques can be used when a new device is tested or after it is in use, either in response to some timing or usage criteria or dynamically in response to an error indication. The defective elements can then be mapped out, either on cellular level or on a block (or other memory subdivision) level.

A third set of embodiment alters the voltage levels at the source-drain regions of the storage elements. In a NAND-type architecture, this can be effected by changing the read or over-drive voltage applied to the non-selected control gates during a read operation or by directly raising the voltage level on the bit line. The current-voltage curve of a good storage element is relatively stable under this shift in bias conditions, while degraded elements exhibit a larger shift. The amount of shift can be used to differentiate the good elements from the bad.

As degraded cells frequently come in clusters, it often makes sense to perform the testing on the basis of blocks or other memory structures. For example, in the third set of embodiments, the threshold level distribution for a block of cells can be determined. As the read voltage on the non-selected cells is changed, the distribution will shift. In particular, if the read voltage is lowered, any bad cells in the block will manifest themselves in the development of a tail to the distribution; whereas a block of only well behaved cells will maintain a relatively tight distribution. Consequently, by varying the bias conditions and looking for the development of a tail in the distributions of threshold voltages, a bad block can be identified and removed.

Additional aspects, features and advantages of the present invention are included in the following description of exemplary embodiments, which description should be taken in conjunction with the accompanying drawings.

BRIEF DESCRIPTION OF THE DRAWINGS

FIG. 1 is an example of a storage element with poor subthreshold slope and weak transconductance.

FIG. 2 is a block diagram of a non-volatile memory system in which the various aspects of the present invention can be implemented.

FIG. 3 illustrates an existing circuit and organization of the memory array of FIG. 2 when a NAND type.

FIG. 4 shows a cross-sectional view, along a column, of a NAND type of memory array formed on a semiconductor substrate.

FIG. 5 provides Table 1 of example operating voltages of the NAND memory cell array of FIGS. 2–5.

FIG. 6 shows subthreshold slope degradation with cycling.

FIG. 7 illustrates threshold voltage shift in one storage element due to changes in read voltage in adjoining elements.

FIG. 8 illustrates threshold voltage shift in a block of storage elements due to changes in read voltage.

DESCRIPTION OF EXEMPLARY EMBODIMENTS

Example Non-Volatile Memory System

With reference to FIGS. 2–5, an exemplary non-volatile memory system is described in which the various aspects of the present invention are implemented, in order to provide specific examples. (FIGS. 2–5 are adapted from U.S. Pat. No. 6,456,528, which is hereby incorporated by reference, and are described there in further detail.) FIG. 2 is a block diagram of a flash memory system. Memory cell array 1 includes a plurality of memory cells M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of a p-type region (labeled as "c-p-well" 11 in FIG. 4) on which the memory cells (M) are formed. The c-source control circuit 4 controls a common source line (labeled as "c-source" in FIG. 3) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface) connected to external control lines that are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

With reference to FIG. 3, an example structure of the memory cell array 1 is described. A flash EEPROM of a NAND type is described as an example. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although four floating gate transistors are shown to be included in each cell unit, for simplicity, a higher number of transistors, such as 8, 16 or even 32, are used.

During a user data read and programming operation, 4,256 cells (M) are simultaneously selected, in this example. The cells (M) selected have the same word line (WL), for example WL2, and the same kind of bit line (BL), for example the even bit lines BLe0 to BLe4255. Therefore, 532 bytes of data can be read or programmed simultaneously. This 532B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

FIG. 4 shows a cross sectional view of a NAND cell unit of the type shown schematically in FIG. 3, in the direction of the bit line (BL). At a surface of a p-type semiconductor substrate 9, a p-type region c-p-well 11 is formed, the c-p-well being enclosed by an n-type region 10 to electrically isolate the c-p-well from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 2).

Each memory cell has a floating gate (FG) that stores an amount of electric charge corresponding to the data being stored in the cell, the word line (WL) forming the gate electrode, and drain and source electrodes made of the n-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

Table I of FIG. 5 summarizes voltages applied to operate the memory cell array 1, in a specific example, each memory cell's floating gate storing two bits, having one of the states "11", "10", "01, "00". This table shows the case where the word line "WL2" and the bit lines of "BLe" are selected for reading and programming. By raising the c-p-well to an erase voltage of 20V and grounding the word lines (WL) of a selected block, the data of the selected block is erased. Since all of the word lines (WL) of the unselected blocks, bit lines (BL), select lines (SG) and c-source are put in a floating state, these are also raised to almost 20V due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to Vdd of a power supply, for example 3V, as well as the unselected bit lines BLo. The unselected word lines WL0, WL1 and WL3 are connected to 10V, the first select gate (SGD) is connected to Vdd, and the second select gate (SGS) is grounded. As a result, a channel potential of the memory cell (M) that is being programmed is set at 0V. The channel potential in the program inhibition is raised to around 6V as a result of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01, or "00".

In the read and verify operations, the select gates (SGD and SGS) and the unselected word lines (WL0, WL1 and WL3) are raised to a read pass voltage of 4.5V to make these as pass gates. The selected word line (WL2) is connected to a voltage, a level of which is specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY01 operation, the selected word line WL2 is connected to 2.4V, so that it is verified that whether the threshold voltage has reached 2.4V. In this verify case, it can be said that a verify level is 2.4V.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, if the threshold voltage is lower than the read or verify level, the potential level of the concerned bit line (BLe) decreases to a low level, for example less than 0.5V, because of the conductive memory cell (M). Further details of the read and verify operations are explained below.

Methods for Identifying Cells with Poor Subthreshold Slope and Reduced Transconductance As described in the background section, non-volatile storage elements are known to suffer from poor subthreshold slope or weak transconductance ($g_m$), a condition sometimes referred to as $g_m$ degraded. The present invention presents method to identify cells suffering from this phenomenon before they corrupt the stored data. Although the use of error correction code (ECC) and other techniques can allow the memory to handle a certain amount of error, if too many cells degrade these techniques will be overwhelmed and data will be corrupted. However, the difference in I-V characteristics of a degraded cell versus a well-behaved cell can be used to identify the degraded cells and remove them from the useful portion of the memory before they cause data corruption. The present invention presents three methods for identifying cells with poor subthreshold slope and reduced transconductance.

Although poor subthreshold slope and low transconductance may arise due to various causes, such as oxide traps, source/drain regions not overlapping the gate, or other causes not fully understood, it is clear that these cells become worse as the memory is cycled, and it is also clear that the cell characteristics can be improved if the cycling damage is allowed to relax. This is shown in FIG. 6, where the I-V curve of a fresh good cell (black squares, 603) differs little from its curve after a large (>$10^4$) number of cycles (open squares, 607), while a bad cell after the same number of cycles (open diamond, 605) displays even worse behavior than a fresh bad cell (black diamonds, 601). As can be seen in FIG. 6, the I-V curve of the highly cycled bad cell is almost a straight line and very flat in this semi-log plot.

Although the specifics of the mechanism are not vital to the present invention, some type of charge model, for example interface states, may play a role in causing the poor subthreshold slope and reduced transconductance. For example, if the selected element corresponds to WL2_0 in the NAND structure of FIG. 4, a possible mechanism could be traps in the dielectric at the edge of the n-type diffusion layer intermediate between WL2_0 and WL3_0. Interface states are described in more detail in U.S. patent application Ser. No. 10/052,924, filed Jan. 18, 2002, which is hereby incorporated by reference. These defective cells can cause stored data to be corrupted if the subthreshold slope deteriorates to the point that the cell is still conducting even when the gate voltage is below the cell threshold. This significantly reduces the read margin and makes the cell very susceptible to "flipping bits" if the read conditions are varied and is usually seen when memories fail after cycling due to some cells flipping from a programmed to an erased state.

The present invention presents several embodiments for determining defective elements of the memory. The various methods either can be performed on a new memory at test time or after the memory has been in operation. This information gained by these methods can then be used to map out defective portions of the memory, both at the cell level and at the level of larger structures (such as the unit of erase or programming), or, if performed at test time, to decide that the entire chip is defective if too large a number of defective elements is found. All of the methods test elements by looking at their properties biased at conditions differing from the program verify conditions of the state to which they were programmed. A first set of embodiments looks at the subthreshold behavior of cycled cells by looking at the amount of current at a low control gate voltage, a second set looks at the transconductance of the cells at an increased threshold voltage, and a third set looks at shifts of the threshold voltage in response to varying source/drain voltage levels.

This first method is illustrated with respect to FIG. 6 and makes use of the fact that, after cycling, the degraded cells still have a significant conduction even at gate voltages below the threshold voltage. This method begins by cycling the memory a number of times, say on the order of $10^4$, and then programming all memory cells to a high threshold state. Since these program-erase cycles are not being performed to store data, they do not need to include a verify process and, consequently, they can be performed more quickly when the cycling is part of a test process then if they were actually storing data. In this case, the large number of program-erase cycles just need to simulate reasonably well the effects on the storage elements of such a large number of cycles. When instead the device is tested after a period of normal operation, this sort of cycling will occur naturally. In either case, when the device is actually tested, the selected storage elements are programmed to the threshold state corresponding to the verify condition where the various curves cross at $I_1$, $V_1$. Although the curves of fresh cells (601, 603) differ significantly below $V_1$, this difference becomes more pronounced after cycling (605, 607).

After cycling and programming the cells to the high threshold voltage state, the gate voltage is then reduced and the cells are read. The sense time can be increased in order to identify the degraded cells. If the cells are seen to be conducting at this reduced gate voltage they are identified as cells with poor subthreshold slope and are no longer used for data storage. Well-behaved cells will have minimal conduction under these conditions. For example, in the case of the data from FIG. 6, both the degraded and the normal cell, after cycling, have been programmed to a threshold voltage of $V_1$. If the cells are now read at a gate voltage of Vcg=~0 Volts, the normal cell will not conduct any significant current. However, the degraded cell will still conduct more than I', say several nanoamps. If the detection threshold is set at, for example, 1 nA, the degraded cell can easily be identified. The detection threshold could be set at a predetermined value, using a settable parameter for example. (For this and the other embodiments, although the sensing process is described in terms of measuring a current in response to an applied set of bias voltages, other sensing methods—where some other parameter besides a current (voltage, time, frequency, etc.), but which is indicative of a cell's I-V curve, is measured—may be used.)

This method, as well as the others discussed below, can either be performed when a new chip is tested or after it has been operating for some time, and at a cellular level or in terms of larger logical or physical units of the memory. For instance, at test time, a number of sectors or programming units of the memory are selected by some selection process or at random and checked. Alternately, the whole memory can be checked, with or without cycling. If the number of bad areas is small, they can be logically remapped; however, as bad portions of a memory often tend to come in extended areas of a die due to processing or other problems, the bad errors may cluster and it may make sense just to reject the whole die. If the testing is instead performed during the operation of the memory, it can be in response to a number of operations, an amount of operation time, a random number of events in the host or memory, in response to an error correction code (ECC) result, programming or erase difficulties, or the periodic moving around of data within the memory. In this way, the testing can be triggered by the same mechanisms as, and possibly in conjunction with, a scrubbing or refresh process, which is described, along with ECC methods, in U.S. Pat. Nos. 5,532,962 and 6,151,246, which are hereby incorporated by reference. For example, after a random number of events (either host or memory events), an arbitrary set of blocks could be checked in order to determine memory difficulties before they develop enough to result in a loss of data.

While the first embodiment of the method looks at the subthreshold region by looking at the current level of a cell for a gate voltage less than its verify voltage, a second embodiment looks at the degraded transconductance of the storage elements for an increased gate voltage. FIG. 1 again presents the I-V curve for a normal cell versus the I-V curve for a degraded cell where they have been programmed to verify at the point $V_1$, $I_1$. As shown by the curve of solid diamonds, the current conduction capability of the degraded storage element is diminished, in other words its transconductance has been degraded. If the cells are in this state, a normal cell can be distinguished from a degraded cell by sensing at a high gate voltage and setting the detection threshold at a relatively high current. For example, in the case of the data from FIG. 1, if the cells are read at a gate voltage of V' is at least somewhat higher than $V_1$, say V'≈2V, the reduced transconductance (poor $g_m$) will result in a much lower current for the bad cell. (Again, it should be noted that the current is plotted on a logarithmic scale.) If the detection threshold is set at a value I' intermediate to the two curves at V', say an I' value of several hundred nanoamps, the degraded cell can be distinguished from the normal cell when read under the bias condition of $V_{cg}$=V'.

While the first two embodiments of the present invention vary the control gate voltage relative to the verify conditions, using a lower value in the first embodiment and a higher value in the second, the third set of embodiments are based mainly on varying the bias level at the source-drain regions of the storage elements. In a NAND-type architecture, this can be implemented by varying the value of $V_{read}$, the voltage applied to the non-selected word lines, such as WL_1 or WL_3 in FIG. 3 when the selected element corresponds to WL_2. As described above with respect to FIG. 5, when a selected element (on WL_2) is being read, the non-selected elements have their word lines (WL_0, WL_1, WL_3) turned fully on by the application of an overdrive reading voltage $V_{read}$. The example uses $V_{read}$=4.5V for a normal read. The third set of embodiments looks at the stability of the cells' threshold voltage with respect to variations in the bias conditions at the source-drain regions; both NAND-type and NOR-type architectures, this can be implemented by directly varying the bit-line levels, while for a NAND-type architecture this can also be implemented by varying the value Of $V_{read}$.

The third set of embodiments makes use of the behavior that the degraded cells will exhibit a larger shift in threshold voltage $V_{th}$ with varying read conditions than well behaved cells. For example, FIG. 7 plots the I-V curves of a degraded cell and a well-behaved cell for different read voltages: The open squares (707) and open diamonds (705) respectively correspond to typical good and bad cells using the standard $V_{read}$ value, while the black squares (703) and black diamonds (701) respectively correspond to typical good and bad cells using a raised $V_{read}$ value. (Again in this example, the read voltage $V_{read}$ refers to the overdrive voltage place on the other cells in the NAND string when measuring the threshold voltage of a particular cell.) The well-behaved cell shows a relatively small shift 753 in $V_{th}$ with the shift in read voltage; however, the impact on the degraded cell is much more significant, as seen in the larger shift 751. This effect can be used to identify the degraded cells by reading a cell at differing source/drain bias conditions and determining whether its threshold voltage suffers a large shift or is relatively stable.

Although the methods of the third embodiment can be implemented on a cellular level, they can also be implemented on a block (or other structural) level. In this case, the effects of degradation can be looked at for the block as a whole. While this is also true of the first and second set of embodiments, it has particular utility for the third embodiment.

FIG. 8 plots the threshold distributions of two populations of cells, with the logarithm of the count for a particular threshold value $V_{th}$ plotted against $V_{th}$. These populations are preferably based on a physical structure of the memory, such as a block or physical sector, since defective cells tend to cluster physically due to processing or other defects, but the techniques also apply to otherwise selected populations. In this example the populations are two blocks, one containing only well behaved cells (Blk A), the other block has some degraded cells (Blk B). The solid squares (801) and solid diamonds (805) respectively give the distribution of threshold values for block A and block B at the standard values of $V_{read}$. In both cases, the distribution is centered near a value $\bar{V}$ and fairly tight, although the bad cell distribution 805 is less so.

Decreasing the bias level at the source-drain regions of the storage elements, for example by lowering the $V_{read}$ value of the non-selected elements of a NAND string, results in a shift of the distributions. This will correspond to the same sort of shifts as seen in FIG. 7 for each of the individual cells. The shift for block A, shown by the curve of open squares (803) exhibits a small shift towards higher $V_{th}$ values. The distribution 803 continues to stay fairly tight.

Decreasing the read voltage causes a more pronounced shift to appear in the $V_{th}$ distribution of the block with the degraded cells, as shown by the open diamond (807). In addition to the shift of the center of the distribution, a large tail appears on the high threshold end of the distribution 807, resulting in a distinct profile relative to both the good block A (at either bias condition) and block B itself at the standard $V_{read}$ value (805). This block could then be identified and eliminated from the active memory to prevent data corruption. The identification can be based on the profile of the block (i.e., the development of the tail), by comparing its change to a fixed amount of shift, or comparing it to the relative amount of shift in other populations, such as that of block A. For example, a cutoff value, shown on FIG. 8 as $V_{cutoff}$, could be introduced. $V_{cutoff}$ is chosen to be separated enough from $\bar{V}$ so that the entire distribution of a block of well-behaved cells stays below $V_{cutoff}$ despite the change in bias conditions, while the bad cells in a block with defects cause a tail to extend past this cutoff. The value of $V_{cutoff}$ can be based upon knowledge of a usual distribution in order to determine a margin above $\bar{V}$ at which to set $V_{cutoff}$.

As with the previous examples, the process described with respect to FIG. 8 can be performed either at test time or later, when the device is already in operation. As with the other techniques, when using the methods described with respect to FIG. 8 as test time, the memory (or at the portions being tested) can be subjected to a number of program-erase cycles before determining the distribution on which the quality of the memory is based. When the process is performed after the memory is already in operation, the controller or peripheral circuitry on the memory chip can execute the process. For example, the controller could perform the comparison using a settable parameter based implementation to determine whether the tail exceeds the allowed limit.

As noted above, the techniques of the present invention can be applied not to just Flash memories having NOR or NAND architectures, but to memories having other forms of storage elements and architectures. They are particularly advantageous in non-volatile memories using storage element including a transistor, wherein the data state stored in the storage element is based upon the current-voltage characteristics of the transistor, such as dielectric memory cells, examples of which are described in the U.S. patent application entitled "Multi-State Non-Volatile Integrated Circuit Memory Systems That Employ Dielectric Storage Elements", by Eliyahou Harari, George Samachisa, Jack H. Yuan, and Daniel C. Guterman, filed Oct. 25, 2002, which is hereby incorporated by this reference.

Although the various aspects of the present invention have been described with respect to specific embodiments, it will be understood that the invention is protected within the full scope of the appended claims.

The invention claimed is:

1. A method of determining the quality of a non-volatile memory having a plurality of storage elements, comprising:
    programming a first population of said storage elements to establish a distribution of threshold values corresponding to a first set of bias conditions; and
    subsequently determining the shift in the distribution of threshold values for the first population of storage elements in response to a second set of bias conditions.

2. The method of claim 1, wherein said first population corresponds to a physical structure of said memory.

3. The method of claim 2, wherein said physical structure is a unit of erase.

4. The method of claim 1, wherein each of said storage elements has a first source-drain region and a second source-drain region and wherein the first set of bias conditions and the second set of bias conditions use differing voltage levels at the source drain regions.

5. The method of claim 4, wherein said non-volatile memory has a NAND architecture and the voltage level on a source-drain region of a selected storage element is determined by the gate voltage level on the unselected storage elements in the NAND string of the selected storage element.

6. The method of claim 4, wherein said non-volatile memory has a NAND architecture and the voltage level on a source-drain region of a selected storage element is determined by the bit-line voltage level in the NAND string of the selected storage element.

7. The method of claim 1, wherein said determining the shift in the distribution comprises determining whether the distribution has developed a tail in response to the second set of bias conditions.

8. The method of claim 1, wherein said determining the shift in the distribution comprises determining whether the shift has exceeded a predetermined criterion.

9. The method of claim 8, further comprising:
    subjecting said first population to a plurality of program-erase cycles prior to said programming.

10. The method of claim 8, wherein said determining the shift in the distribution comprises determining whether the threshold value of one or more elements of the first population has exceeded a predetermined value in response to the second set of bias conditions.

11. The method of claim 8, wherein said predetermined criterion is based on settable parameter stored in said memory.

12. The method of claim 1, further comprising:
    programming a second population of said storage elements to establish a distribution of threshold values corresponding to the first set of bias conditions;
    subsequently determining the shift in the distribution of threshold values for the second population of storage elements in response to the second set of bias conditions; and
    comparing the shift in distributions for the first population with the shift in distributions for the second population.

13. The method of claim 1, wherein said method is performed as part of an initial test of said memory.

14. The method of claim 1, wherein said method is performed subsequent to the operation of said memory.

15. The method of claim 14, wherein said method is performed in response to an error correction code (ECC) response.

16. The method of claim 14, wherein said method is performed in response to the number of operations performed.

17. The method of claim 14, wherein said memory further comprises a controller and said determining is performed by the controller.

18. The method of claim 1, wherein said first population is selected at random.

19. The method of claim 1, further comprising:
    logically remapping the first population in response to said determining.

20. A method of determining defective storage elements of a non-volatile memory comprising a plurality of such elements, wherein the data state of said elements is a function of their current-voltage characteristics, the method comprising:
    programming a first of said storage elements to a state determined by a first current level through the storage element in response to the application of a first set of bias conditions;
    applying a second set of bias conditions differing from the first set of bias conditions to the first storage element;
    determining a parameter indicative of the current level through the first storage element in response to applying the second set of bias conditions; and
    determining whether the first storage element is defective based upon the value of said parameter.

21. The method of claim 20, wherein said second set of bias conditions includes a control gate voltage lower than the control gate voltage in the first set of bias conditions and said determining whether the first storage element is defective comprises:
    determining whether the current level through the first storage element in response to applying the second set of bias conditions is above a first current level.

22. The method of claim 21, further comprising:
    subjecting the first storage element to a number of program-erase cycles prior to said programming the first storage element.

23. The method of claim 22, wherein said number of program-erase cycles is greater than a thousand.

24. The method of claim 22, wherein said method is performed as part of an initial test of said memory.

25. The method of claim 21, wherein the control gate voltage of the second set of bias conditions is approximately zero volts.

26. The method of claim 20, wherein said second set of bias conditions includes a control gate voltage higher than the control gate voltage in the first set of bias conditions and said determining whether the first storage element is defective comprises:
   determining whether the current level through the first storage element in response to applying the second set of bias conditions is below a first current level.

27. The method of claim 26, wherein the control gate voltage of the second set of bias conditions is approximately twice the control gate voltage in the first set of bias conditions.

28. The method of claim 20, wherein said second set of bias conditions includes a source-drain region voltage different than a source-drain region voltage in the first set of bias conditions.

29. The method of claim 28, wherein said determining whether the first storage element is defective comprises:
   determining the change in control gate voltage required to obtain the same current level through the first storage element as in response to applying the first set of bias conditions.

30. The method of claim 29, wherein said determining whether the first storage element is defective further comprises:
   comparing the change in control gate voltage to a fixed criteria.

31. The method of claim 28, wherein memory has a NAND type architecture and the voltage at the source drain region of the first storage element is related to the control gate voltage of one or more of the other storage elements in the same NAND string as the first storage element.

32. The method of claim 20, wherein said method is performed as part of an initial test of said memory.

33. The method of claim 20, wherein said method is performed subsequent to the operation of said memory.

34. The method of claim 20, wherein said method is performed in response to an error correction code (ECC) response.

35. The method of claim 20, wherein said method is performed in response to the number of operations performed.

36. The method of claim 20, wherein said first storage element is selected at random.

37. The method of claim 20, further comprising:
   in response to said determining whether the first storage element is defective, logically remapping the first storage element.

* * * * *